United States Patent [19]

Hamamoto

[11] Patent Number: 5,381,107
[45] Date of Patent: Jan. 10, 1995

[54] TIME-BASE INVERSION TYPE LINEAR PHASE FILTER OF THE INFINITE IMPULSE RESPONSE TYPE HAVING LINEAR PHASE CHARACTERISTICS

[75] Inventor: Yasuo Hamamoto, Higashiosaka, Japan

[73] Assignee: Matsushita Electric Industrial Co., Ltd., Osaka, Japan

[21] Appl. No.: 43,741

[22] Filed: Apr. 7, 1993

[30] Foreign Application Priority Data

Apr. 10, 1992 [JP] Japan .................................. 4-090501

[51] Int. Cl.[6] .............................................. H03B 1/04
[52] U.S. Cl. .................................... 327/306; 327/551; 327/552
[58] Field of Search ................ 307/269, 511, 520, 543, 307/556; 328/72, 63, 165, 167

[56] References Cited

U.S. PATENT DOCUMENTS

5,299,003  3/1994  Ochi et al. ........................... 358/340

*Primary Examiner*—William L. Sikes
*Assistant Examiner*—Jim Dudek
*Attorney, Agent, or Firm*—Wenderoth, Lind & Ponack

[57] ABSTRACT

In a time-base inversion type linear phase filter, an input signal is time-base inverted, and thereafter delayed. The delayed signal is time-base inverted back to the original time sequence and then filtered by a first IIR filter. First and second selectors alternately select the time-base inverted signal and the delayed signal in opposite phases to each other. Output signals of the selectors are filtered by second and third IIR filters and then alternately selected by a third selector. An output of the third selector is time-base inverted back to the original time sequence and added to an output of the first IIR filter. A nonlinear emphasis/de-emphasis apparatus is constituted by using this linear phase filter.

6 Claims, 4 Drawing Sheets

TIME-BASE INVERSION TYPE LINEAR PHASE FILTER OF THE INFINITE IMPULSE RESPONSE TYPE HAVING LINEAR PHASE CHARACTERISTICS

BACKGROUND OF THE INVENTION

1. Field of the Invention

The present invention relates to an improved time-base inversion type linear phase filter of IIR (Infinite Impulse Response) type having linear phase characteristics and to a nonlinear emphasizing and a nonlinear de-emphasizing circuit each containing such an improved time-base inversion type linear phase filter.

2. Description of the Prior Art

In a time-base inversion type linear phase filter shown in U.S. Pat. No. 5,299,303 (titled "Signal Processing Apparatus For Changing the Frequency Characteristics of An Input Signal") to Atsuo Ochi et al., a pair of signals having different time-base inversion phases are filtered with a pair of IIR filters arranged in parallel and then reconstructed by alternate switching to a signal which is equivalent to a signal obtained by time-base inversion using an infinite-length memory followed by filtering.

The operation and principle of the linear phase filter are described in greater detail in the above-noted U.S. Patent.

In such a linear phase filter, the input signals of the two IIR filters are required to be time-base inverted at intervals of a period which is two times longer than the duration of the filter's impulse response and thus different in the inversion phase from each other by the impulse response duration. For producing the time-base inverted signals, it is necessary to provide two time-base inverting circuits each using a memory having a storage capacity for storing signal data in each period which is two times longer than the impulse response duration. Also another time-base inverting circuit must be provided using a memory having a storage capacity of storing signal data in each impulse response duration for inverting back the signal reconstructed by switching of the outputs of the IIR filters to an original phase form, and a memory must be provided having a storage capacity for storing signal data in a period which is four times longer than the impulse response duration for compensation for the time delay caused by the time-base inversion processings.

In total, the memory size for storing data in the period which is nine times longer than the impulse response duration is needed. If the impulse response of the IIR filter ranges from 20 to 30 clock period durations, the total memory size corresponds to more than ten thousand of gates. Accordingly, it will be not easy to construct the whole circuit on an LSI chip. It is desirable for the memory size to be as small as possible.

SUMMARY OF THE INVENTION

It is a first object of the present invention to provide a time-base inversion type linear phase filter having a minimum memory size.

To achieve the first object, a time-base inversion type linear phase filter according to the present invention comprises: a first time-base inverting circuit for inverting a time sequence of an input signal in each of consecutive time units each having a predetermined period; a delay circuit for delaying an output signal of the first time-base inverting circuit by a period which is twice the predetermined period; a second time-base inverting circuit for inverting a time sequence of an output signal of the delay circuit in each of the consecutive time units each having the predetermined period in the same time sequence as that of the input signal in each time unit; a first IIR filter for filtering an output signal of the second time-base inverting circuit; a first selector for alternately selecting the output signals of the first time-base inverting circuit and the delay circuit by switching at intervals of the predetermined period; a second selector for alternately selecting the output signals of the delay circuit and the first time-base inverting circuit by switching at intervals of the predetermined period and opposite in phase to the switching of the first selector; a second IIR filter for filtering an output signal of the first selector; a third IIR filter for filtering an output signal of the second selector; a third selector for alternately selecting output signals of the second and third IIR filters by switching at intervals of the predetermined period and the same in phase as the switching of the first selector; a third time-base inverting circuit for inverting a time sequence of an output signal of the third selector in each of the consecutive time units each having the predetermined period; and an adder for adding an output signal of the first IIR filter and an output signal of the third time-base inverting circuit to obtain an output signal of the time-base inversion type linear phase filter.

In this arrangement of the time-base inversion type linear phase filter, the predetermined period of each time unit in which the time-inversion is carried out may be equal to or longer than a period within which the impulse response of each IIR filter converges to a constant value, i.e., within a duration of the impulse response of each IIR filter. In other words, the period of the time unit in which the time-inversion is carried out may not be twice as long as the duration of the impulse response of the IIR filter. Each of the first through third time-base inverting circuits may be constituted by a memory having a storage capacity for storing signal data in the period equal to the duration of the impulse response of the IIR filter, and the delay circuit may be constituted by a memory having a storage capacity for storing signal data in the period twice the duration of the impulse response of the IIR filter. Accordingly, the total storage capacity of the time-base inversion type linear phase filter of the invention may be the capacity for storing signal data in the period five times the duration of the impulse response of the IIR filter. That is, the memory size can be reduced to 5/9 compared with the conventional filter described before.

It is a second object of the present invention to provide a linear-phase nonlinear emphasis apparatus having a minimum size of memory storage.

For achievement of the second object, a nonlinear emphasis apparatus according to the present invention comprises: the above time-base inversion type linear phase filter; a nonlinear circuit for non-linearly amplifying an output of the time-base inversion type linear phase filter with amplitude limiting below a threshold value; and an adder for adding an output of the nonlinear circuit and an output of the second time-base inverting circuit of the time-base inversion type linear phase filter to obtain an emphasized signal output.

As a result, the memory size in the emphasis apparatus is minimized.

It is a third object of the present invention to provide a linear-phase nonlinear de-emphasis apparatus having a minimum size of memory storage.

For achievement of the third object, a nonlinear de-emphasis apparatus comprises: the above time-base inversion type linear phase filter; a nonlinear circuit for nonlinearly amplifying an output of the time-base inversion type linear phase filter with amplitude limiting below a threshold value; and a subtractor for subtracting an output of the nonlinear circuit from an output of the second time-base inverting circuit of the time-base inversion type linear phase filter to produce a de-emphasized signal output.

As a result, the memory size in the de-emphasis apparatus is minimized.

As set forth above, the present invention allows the signal inverting circuit to perform signal inversion using a smaller size memory than that of the prior art. Accordingly, the time-base inversion type linear phase filter and the nonlinear emphasis and nonlinear de-emphasis circuits using the same can be fabricated in simple constructions and if desired, arranged in LSI forms with much ease.

DESCRIPTION OF THE PREFERRED EMBODIMENTS

Figure 1:
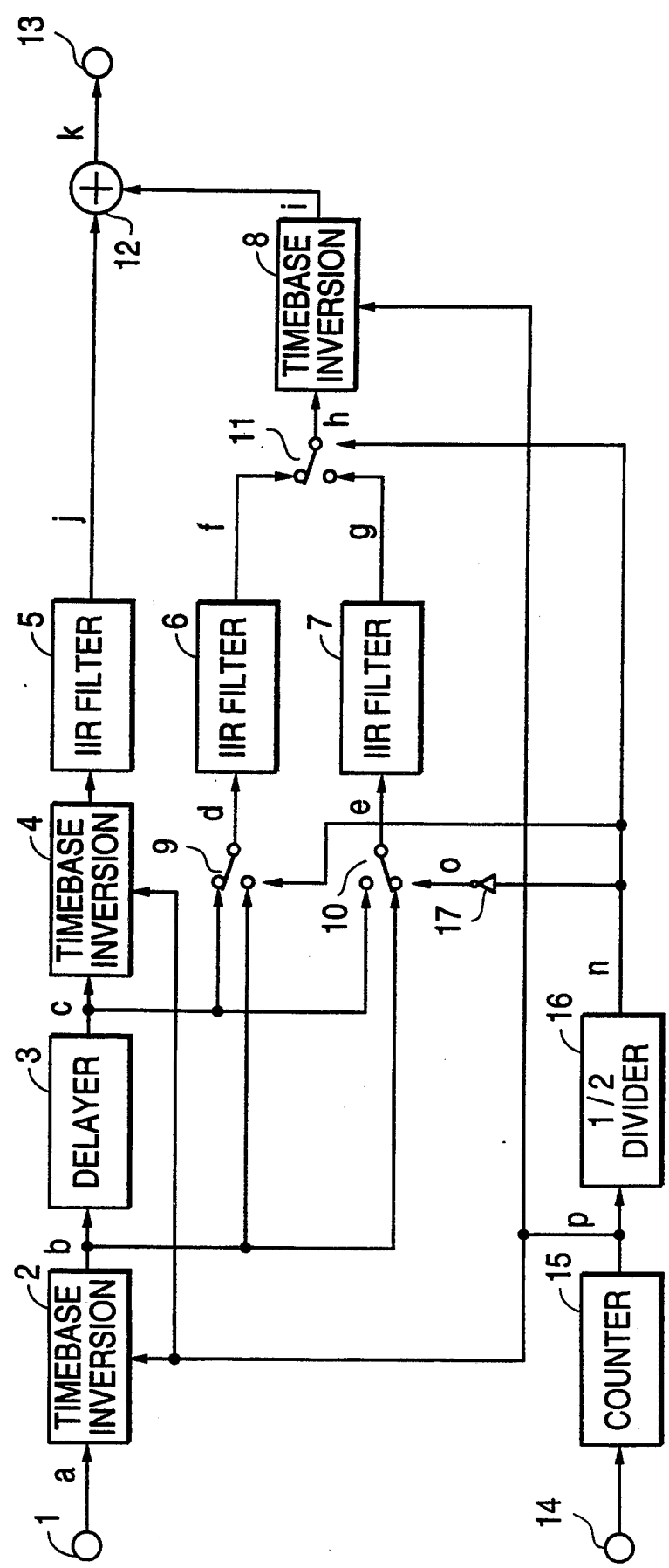
FIG. 1 is a block diagram of a time-base inversion type linear phase filter circuit in accordance with a first preferred embodiment of the present invention.

FIG. 1 illustrates a block diagram of a time-base inversion type linear phase filter circuit in accordance with a first preferred embodiment of the present invention.

Figure 2:
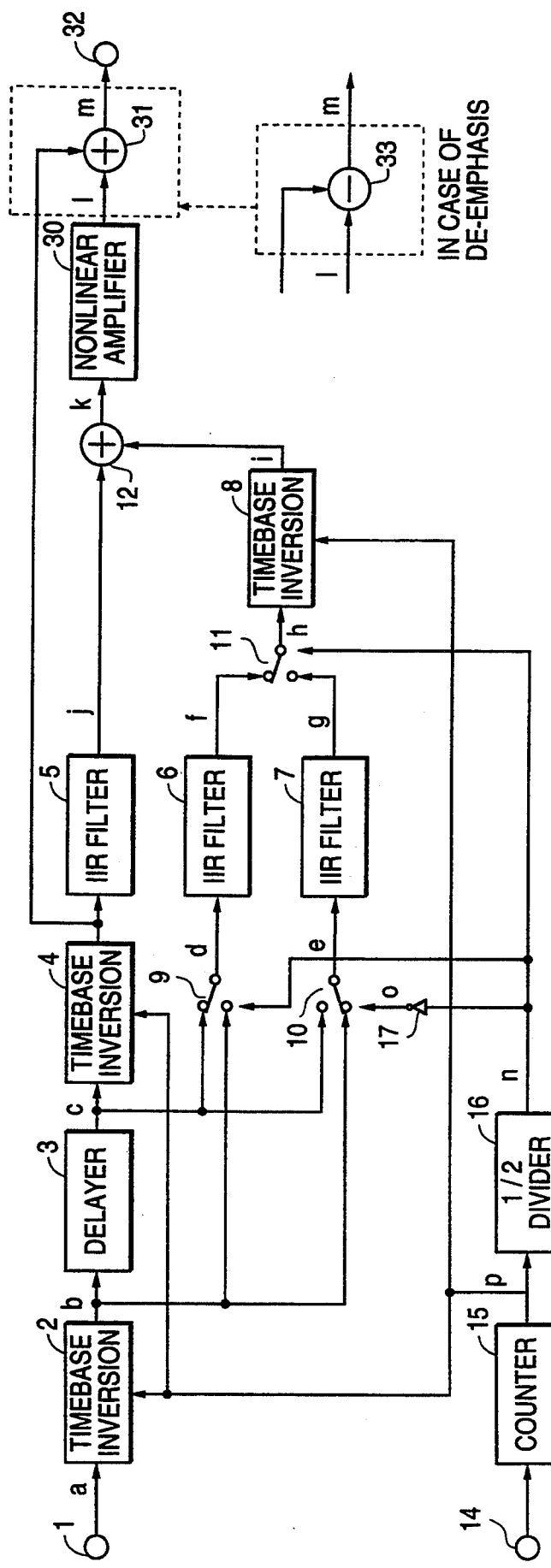
FIG. 2 is a block diagram of a nonlinear emphasis circuit in accordance with a second embodiment of the present invention or a nonlinear de-emphasis circuit in accordance with a third embodiment of the present invention.

FIGS. 4(a)–4(p) are waveform diagrams showing signal waveforms and their inverted states appearing at the specific locations in the circuits shown in FIGS. 1 and 2. The time-base inversion is carried out in each of blocks denoted by the numerals 0 to 15. Hence, the block represents a unit for signal processing. More specifically, the illustrated waveforms are of signal outputs of respective components and denoted by the alphabetic letters which also appear in FIGS. 1 and 2.

The signal processing will be explained in more detail referring to the drawings.

Figure 4:
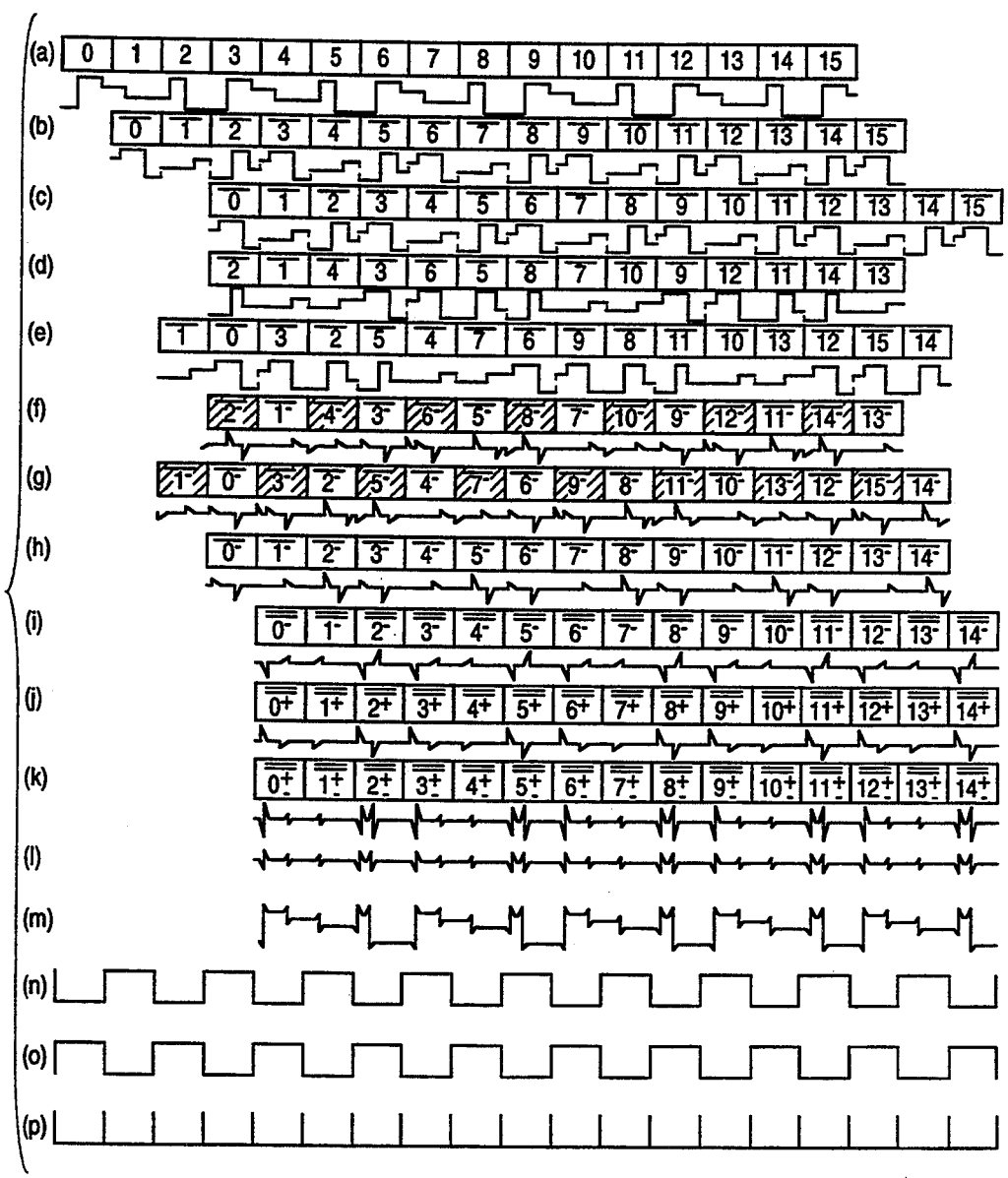
FIGS. 4(a)–4(p) are waveform diagrams showing a variety of signals appearing at corresponding locations in FIGS. 1 and 2.

Referring to FIG. 1, an input signal as shown in FIG. 4(a) is introduced from an input terminal 1. The input signal is in digital form produced from an original analog signal by an A/D converter (not shown). The input signal is fed to a time-base inverting circuit 2 where it is time-base inverted in each block having a period longer than a duration in which the impulse response of an IIR filter has settled to a constant value. Here, the time-base inversion is to invert the time sequence of the signal in a block and can be realized by sequentially writing the signal into a memory and reading out the written signal in a sequence reverse to the written sequence. The time-base inverting circuit 2 is controlled by a clock signal of FIG. 4(p) from a counter 15 which counts clock pulses supplied from an input terminal 14. The signal shown in FIG. 4(b) represents a time-base inverted form of the signal a. The line above the numeral in each block indicates that the block is time-base inverted. The time-base inverted signal b is then delayed by a period of two blocks by delay circuit 3 as shown in FIG. 4(c). Both the signals b and c are transmitted to each of two selectors 9 and 10 which in turn deliver two signals d and e respectively. The selectors 9 and 10 are actuated by two control signals denoted by n and o of FIG. 4 respectively. The control signal n is produced by dividing the clock output p of the counter 15 by a ½ frequency divider 16. The control signal o is produced by inverting the signal n by an inverter 17. As understood, the selectors 9 and 10 are controlled by the two discrete signals n and 0 which are identical in the length of period to the time-base inverting period of the time-base inverting circuit 2 and opposite in the phase to each other to alternately select the signals b and c complimentarily to each other to obtain the signals d and e. More specifically, in one block period the selector 9 selects the signal b while the selector 10 selects the signal c, and in the next block period the selector 9 selects the signal c while the selector 10 selects the signal b. Accordingly, each of the two signals d and e appears time-base inverted in the period equal to two times the time-base inversion period of the time-base inverting circuit 2. Also, the two signals d and e are phase shifted by the time-base inversion period of the time-base inverting circuit 2 from each other.

Figure 3:
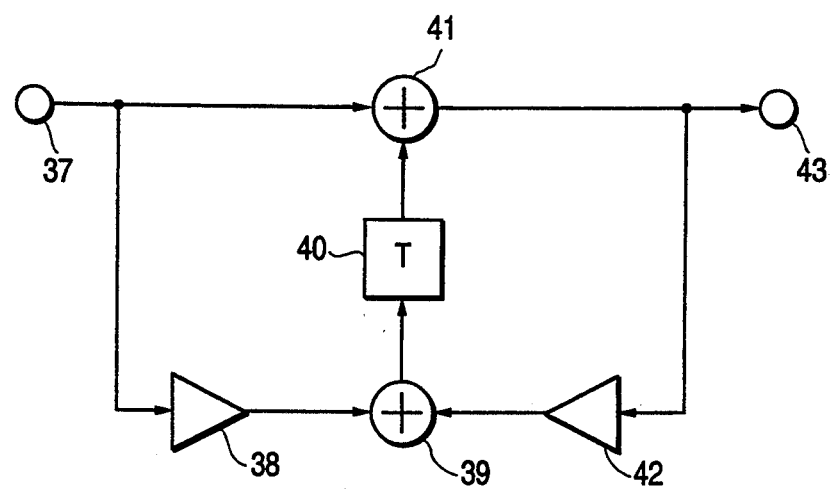
FIG. 3 is a block diagram of an IIR filter.

The two different phase signals d and e are respectively fed to two IIR filters 6 and 7 which have the same filtering characteristic. Each of the IIR filters 6 and 7 is an ordinary phase rotating filter, as shown in FIG. 3, comprising an input terminal 37, two multipliers 38 and 42, two adders 39 and 41, a delay circuit 40, and an output terminal 43.

The two signals d and e are filtered by the IIR filters 6 and 7 into two outputs denoted by f and g in FIG. 4 respectively. The symbol "-" on the upper right of each block numeral of the signals f and g means that the block has been filtered. The IIR filters are highpass filters which extract only signal edges. The output signals f and g of the respective filters 6 and 7 contain unwanted spikes immediately after the border of every two blocks due to time-base inversion at the period of two blocks. However, each of such spikes will disappear within the duration of the impulse response of the IIR filter, so that it affects only the first half of the time-base inversion period. More particularly and the shaded blocks of the signals f,g are affected by such spikes. It is seen that the blocks having no unwanted spikes occurs alternately with the shaded blocks.

The signals f and g are transmitted to a selector 11 which alternately selects the signals f and g to obtain a chain of spike-free blocks as an output signal denoted by h. The action of the selector 11 is controlled by the same control signal n as of the selector 9.

The signal h is time-base inverted once again by a time-base inverting circuit 8 to return to the original time-base. The time-base inversion is controlled in the same manner as of the first time-base inverting circuit 2. As the result, an output signal of the time-base inverting circuit 8 denoted by i is produced. The signal i is equivalent to a signal generated from the input signal a through time-base inversion with an infinite-length memory and filtering.

The output signal c of the delay circuit 3 is transmitted also to a time-base inverting circuit 4 where it is inverted back to the original time-base. The time-base inverting circuit 4 is controlled in the same manner as of the other time-base inverting circuits 2 and 8. An output signal of the time-base inverting circuit 4 is equal to the input signal a by a delay of four blocks. The delay by four blocks is identical to the delay of the signal i. The output of the time-base inverting circuit 4 is then filtered with an IIR filter 5 to be a signal j. The numeral of each block of the signal j has a "+" sign on its upper right indicating that the block has been filtered in the state without time-base inversion.

The two signals i and j are added to each other by an adder 12 to obtain a filter output denoted by k which has no phase distortion because of the cancellation of the phase rotation components. The filter output k is outputted from an output terminal 13.

FIG. 2 is a block diagram showing a second preferred embodiment of the present invention.

Figure 5:
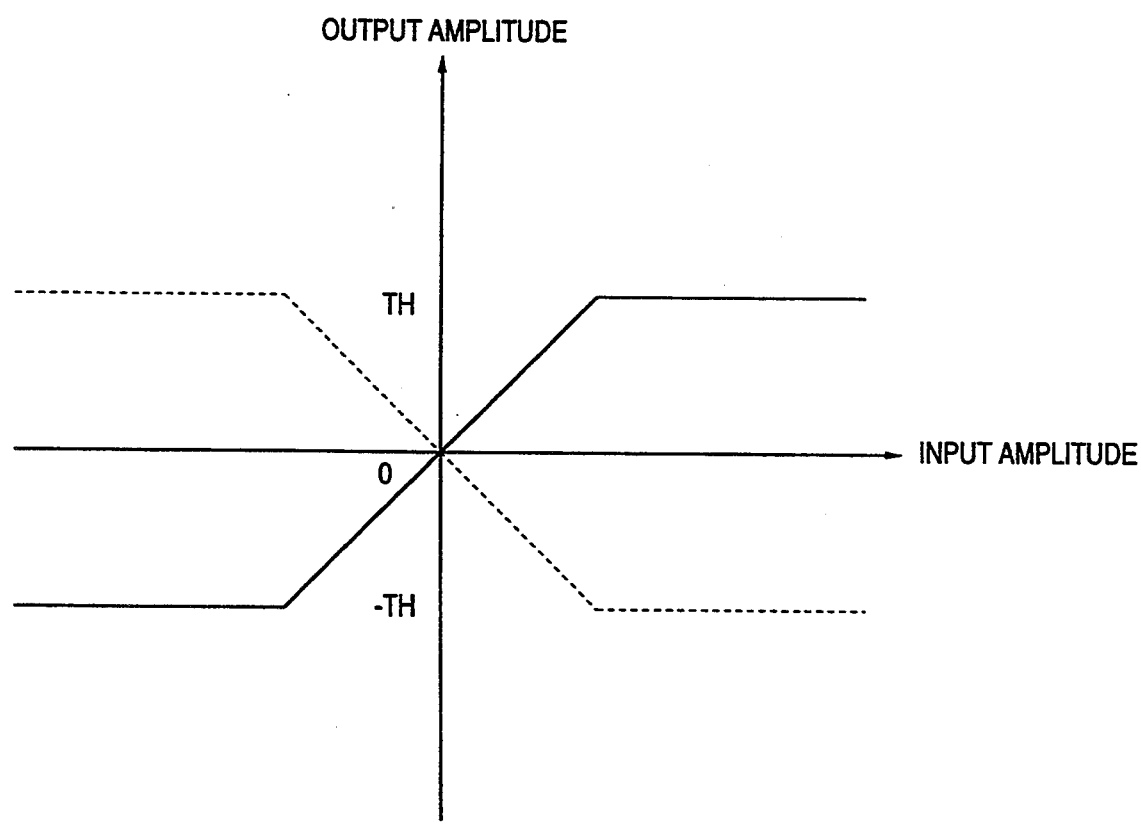
FIG. 5 is a graphic representation showing input/output characteristics of a nonlinear amplifying circuit in FIG. 2.

More specifically, the block diagram of FIG. 2 represents a nonlinear emphasis circuit using the time-base inversion type linear phase filter of the first embodiment. The action of the time-base inversion type linear phase filter is identical to that of the first embodiment. In this emphasis circuit, the filter output k is fed to a nonlinear amplifying circuit 30 where the amplitude thereof is limited. The nonlinear amplifying circuit 30 may have an input-output characteristic shown in FIG. 5. The horizontal axis of FIG. 5 denotes an input level and the vertical axis is an output level. If the gain of the filter section of the nonlinear emphasis circuit is positive, the input signal is amplified by the constant gain until the output level reaches a threshold level TH as shown by the solid line of the input-output characteristic in FIG. 5. The output level is limited to the threshold level TH regardless of further increases of the input level. Accordingly, the input of a positive value produces the positive threshold TH and the input of a negative value produces a negative threshold —TH.

The signal denoted by 1 in FIG. 4 represents an output of the nonlinear amplifying circuit 30 resulting from the nonlinear processing of the signal k, exhibiting limitation of an excessive part of the amplitude. The signal 1 is added to the output signal of the time-base inverting circuit 4 by an adder 31. Since the original input signal a precedes the signal 1 by four blocks, the output signal of the time-base inverting circuit 4 is substitutionally used as an equivalent of the original input signal because the timing has to be matched. The output signal of the time-base inverting circuit 4 has been time-base inverted two times and time delayed by two blocks one time, and thus, matches the signal i in the phase, i.e., in the timing of blocks.

As the result, a large amplitude signal can be less emphasized and a small amplitude signal can be largely emphasized by the nonlinear emphasis circuit. A resultant nonlinearly emphasized signal denoted by m is outputted from an output terminal 32.

A third preferred embodiment of the present invention is provided in the form of a nonlinear de-emphasis circuit corresponding to the nonlinear emphasis circuit of the second embodiment. The arrangement of the de-emphasis circuit is almost identical to that of the nonlinear emphasis circuit shown in FIG. 2. To perform a de-emphasis processing, the adder 31 of the emphasis circuit may be replaced by a subtractor 33. Alternatively, the nonlinear amplifying circuit 30 may have the input-output characteristic as shown by the dotted line in FIG. 5 in which the amplifying factor is negative.

Accordingly, a large amplitude signal can be less de-emphasized and a small amplitude signal can be largely de-emphasized by the nonlinear de-emphasis circuit of the third embodiment. A resultant nonlinearly de-emphasized signal is outputted from the output terminal 32.

What is claimed is:

1. A time-base inversion type linear phase filter comprising:

a first time-base inverting circuit for inverting a time sequence of an input signal in each of consecutive time units each having a predetermined period;

a delay circuit for delaying an output signal of the first time-base inverting circuit by a period which is twice the predetermined period;

a second time-base inverting circuit for inverting a time sequence of an output signal of the delay circuit in each of the consecutive time units each having the predetermined period in the same time sequence as that of the input signal in each time unit;

a first IIR filter for filtering an output signal of the second time-base inverting circuit;

a first selector for alternately selecting the output signals of the first time-base inverting circuit and the delay circuit by switching at intervals of the predetermined period;

a second selector for alternately selecting the output signals of the delay circuit and the first time-base inverting circuit by switching at intervals of the predetermined period and opposite in phase to the switching of the first selector;

a second IIR filter for filtering an output signal of the first selector;

a third IIR filter for filtering an output signal of the second selector;

a third selector for alternately selecting output signals of the second and third IIR filters by switching at intervals of the predetermined period and the same in phase as the switching of the first selector;

a third time-base inverting circuit for inverting a time sequence of an output signal of the third selector in each of the consecutive time units each having the predetermined period; and an adder for adding an output signal of the first IIR filter and an output signal of the third time-base inverting circuit to obtain an output signal of the time-base inversion type linear phase filter.

2. A nonlinear emphasis apparatus comprising:

a time-base inversion type linear phase filter comprising:

a first time-base inverting circuit for inverting a time sequence of an input signal in each of consecutive time units each having a predetermined period;

a delay circuit for delaying an output signal of the first time-base inverting circuit by a period twice the predetermined period;

a second time-base inverting circuit for inverting a time sequence of an output signal of the delay circuit in each of the consecutive time units each having the predetermined period in the same time sequence as that of the input signal in each time unit;

a first IIR filter for filtering an output signal of the second time-base inverting circuit;

a first selector for alternately selecting the output signals of the first time-base inverting circuit and the delay circuit by switching at intervals of the predetermined period;

a second selector for alternately selecting the output signals of the delay circuit and the first time-base inverting circuit by switching at intervals of the predetermined period and opposite in phase to the switching of the first selector;

a second IIR filter for filtering an output signal of the first selector;

a third IIR filter for filtering an output signal of the second selector;

a third selector for alternately selecting output signals of the second and third IIR filters by switching at intervals of the predetermined period and the same in phase as the switching of the first selector;

a third time-base inverting circuit for inverting a time sequence of an output signal of the third selector in each of the consecutive time units each having the predetermined period; and an adder for adding an output signal of the first IIR filter and an output signal of the third time-base inverting circuit to obtain an output signal of the time-base inversion type linear phase filter;

a nonlinear amplifier for nonlinearly amplifying the output signal of the time-base inversion type linear phase filter; and an adding circuit for adding an output signal of the nonlinear amplifier to the output signal of the second time-base inverting circuit to obtain a nonlinearly emphasized signal.

3. The nonlinear emphasis apparatus according to claim 2, wherein the nonlinear amplifier amplifies the output signal of the time-base inversion type linear phase filter with a positive gain and limits an amplitude of an amplified signal within a predetermined threshold level.

4. A nonlinear de-emphasis apparatus comprising:

a time-base inversion type linear phase filter comprising:

a first time-base inverting circuit for inverting a time sequence of an input signal in each of consecutive time units each having a predetermined period;

a delay circuit for delaying an output signal of the first time-base inverting circuit by a period twice the predetermined period;

a second time-base inverting circuit for inverting a time sequence of an output signal of the delay circuit in each of the consecutive time units each having the predetermined period in the same time sequence as that of the input signal in each time unit;

a first IIR filter for filtering an output signal of the second time-base inverting circuit;

a first selector for alternately selecting the output signals of the first time-base inverting circuit and the delay circuit by switching at intervals of the predetermined period;

a second selector for alternately selecting the output signals of the delay circuit and the first time-base inverting circuit by switching at intervals of the predetermined period and opposite in phase to the switching of the first selector;

a second IIR filter for filtering an output signal of the first selector;

a third IIR filter for filtering an output signal of the second selector;

a third selector for alternately selecting output signals of the second and third IIR filters by switching at intervals of the predetermined period and the same in phase as the switching of the first selector;

a third time-base inverting circuit for inverting a time sequence of an output signal of the third selector in each of the consecutive time units each having the predetermined period; and an adder for adding an output signal of the first IIR filter and an output signal of the third time-base inverting circuit to obtain an output signal of the time-base inversion type linear phase filter;

a nonlinear amplifier for nonlinearly amplifying the output signal of the time-base inversion type linear phase filter; and an operation circuit for operating an output signal of the nonlinear amplifier and the output signal of the second time-base inverting circuit to obtain a nonlinearly de-emphasized signal.

5. The nonlinear de-emphasis apparatus according to claim 4, wherein the nonlinear amplifier amplifies the output signal of the time-base inversion type linear phase filter with a positive gain and limits an amplitude of an amplified signal within a predetermined threshold level, and the operation circuit comprises a subtractor for subtracting the output signal of the nonlinear amplifier from the output signal of the second time-base inverting circuit.

6. The nonlinear de-emphasis apparatus according to claim 4, wherein the nonlinear amplifier amplifies the output signal of the time-base inversion type linear phase filter by a negative gain and limits an amplitude of an amplified signal within a predetermined threshold level, and the operation circuit comprises an adder for adding the output-signal of the nonlinear amplifier to the output signal of the second time-base inverting circuit.

\* \* \* \* \*